(12) United States Patent
de Jong et al.

(10) Patent No.: US 12,265,248 B1
(45) Date of Patent: *Apr. 1, 2025

(54) ELECTRONIC DEVICES WITH OPTICAL SENSOR ISOLATION

(71) Applicant: Apple Inc., Cupertino, CA (US)

(72) Inventors: Erik G. de Jong, San Francisco, CA (US); Jean-Pierre S. Guillou, Los Gatos, CA (US); Michael B. Wittenberg, San Francisco, CA (US); Ueyn L Block, Menlo Park, CA (US); Vivek Venugopal, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 1072 days.

This patent is subject to a terminal disclaimer.

(21) Appl. No.: 17/064,315

(22) Filed: Oct. 6, 2020

Related U.S. Application Data

(60) Provisional application No. 62/929,496, filed on Nov. 1, 2019.

(51) Int. Cl.
| | |
|---|---|
| *G02B 6/08* | (2006.01) |
| *F21V 8/00* | (2006.01) |
| *H01L 31/02* | (2006.01) |
| *H01L 31/0203* | (2014.01) |
| *H01L 31/0256* | (2006.01) |

(52) U.S. Cl.
CPC ............. *G02B 6/0078* (2013.01); *G02B 6/08* (2013.01); *H01L 31/02024* (2013.01); *H01L 31/0203* (2013.01); *H01L 31/0256* (2013.01)

(58) Field of Classification Search
CPC ........... H01L 31/02024; H01L 31/0203; H01L 31/0256; G02B 6/0078; G02B 6/08
See application file for complete search history.

(56) References Cited

U.S. PATENT DOCUMENTS

| | | | |
|---|---|---|---|
| 7,450,243 B2 | 11/2008 | Marks et al. | |
| 9,274,369 B1 | 3/2016 | Lee et al. | |
| 10,223,952 B2 | 3/2019 | Powell et al. | |
| 10,579,157 B1 | 3/2020 | Wilson | |
| 10,620,365 B2 | 4/2020 | Dawson | |
| 2005/0243415 A1 | 11/2005 | Lowe et al. | |
| 2017/0006199 A1* | 1/2017 | Ishihara | H04N 23/45 |

(Continued)

FOREIGN PATENT DOCUMENTS

| | | | | |
|---|---|---|---|---|
| FR | 2579370 A | * | 9/1986 | H01J 9/42 |
| JP | H10253841 A | * | 9/1998 | |

*Primary Examiner* — Ermias T Woldegeorgis
(74) *Attorney, Agent, or Firm* — Treyz Law Group, P.C.; Tianyi He

(57) ABSTRACT

An electronic device may have image transport layer material such as coherent fiber bundle material or Anderson localization material. The image transport layer material may overlap optical components. Optical sensor components can emit and/or detect light passing through the image transport layer material. Optical components such as light-emitting diodes may emit light through image transport layers. An image from a display may pass through an image transport layer. Infrared light-emitting diodes, infrared photodetectors, and/or other optical sensor components may be used to form a two-dimensional optical touch sensor that is configured to gather touch input from an external object such as a finger of a user. The optical touch sensor may operate through an image transport layer.

25 Claims, 18 Drawing Sheets

(56) References Cited

U.S. PATENT DOCUMENTS

| | | |
|---|---|---|
| 2017/0139131 A1 | 5/2017 | Karafin et al. |
| 2018/0128973 A1 | 5/2018 | Powell et al. |
| 2019/0015023 A1 | 1/2019 | Monfre |
| 2019/0391326 A1* | 12/2019 | Yang .................. G02B 6/08 |

* cited by examiner

ELECTRONIC DEVICES WITH OPTICAL SENSOR ISOLATION

This application claims the benefit of provisional patent application No. 62/929,496, filed Nov. 1, 2019, which is hereby incorporated by reference herein in its entirety.

FIELD

This relates generally to electronic devices, and, more particularly, to electronic devices with displays.

BACKGROUND

Electronic devices may have displays. Displays have arrays of pixels for displaying images for a user. The shape and other characteristics of many displays can pose challenges during integration of displays and other components into an electronic device, particularly in situations where space is limited.

SUMMARY

An electronic device may have image transport layer material such as coherent fiber bundle material or Anderson localization material. The image transport layer material may form an image transport layer that overlaps optical components.

The optical components may include optical sensor components. Optical sensor components may include light-emitting devices such as light-emitting diodes that emit light that passes through an image transport layer. Optical sensor components may also include light-sensing devices such as photodetectors that can detect light passing through an image transport layer.

Optical components in an electronic device may include light-emitting diodes that serve as camera flash devices. During operation, a camera flash may emit illumination for a camera that passes through an image transport layer. In some configurations, light-emitting diodes in a display may display an image. An image from a display may pass through an image transport layer.

If desired, infrared light-emitting diodes, infrared photodetectors, and/or other optical sensor components may be used to form a two-dimensional optical touch sensor that is configured to gather touch input from an external object such as a finger of a user. The two-dimensional optical touch sensor may operate through an image transport layer. This image transport layer may overlap a display.

DETAILED DESCRIPTION

An electronic device may have a display. The display may have an array of pixels for creating an image. The image may pass through a display cover layer that overlaps the array of pixels. To minimize display borders or to otherwise create a desired appearance for the display, the display cover layer may include an image transport layer. The image transport layer may have an input surface that receives an image from the array of pixels and a corresponding output surface to which the image is transported from the input surface. A user viewing the image transport layer will view the image from the array of pixels as being located on the output surface.

In configurations in which the input and output surfaces have different shapes, the image transport layer may be used to warp the image produced by the array of pixels. For example, the shape of the image can transformed and the effective size of the image can be changed as the image passes through the image transport layer. In some configurations, edge portions of the image are stretched outwardly to help minimize display borders.

Image transport layers can be formed from coherent fiber bundles (sometimes referred to as fiber optic plates) and/or Anderson localization material. Glass and/or polymer may be used in forming image transport layer structures. To help protect the output surface of an image transport layer, an optional transparent protective layer may be included on the outer surface of the display cover layer. This transparent protective layer may be, for example, a glass plate or a protective layer formed from other transparent material such as clear polymer or sapphire or other crystalline materials. In some arrangements, image transport layers and/or protective layers can be formed over components other than displays.

To help reduce interference between optical components in an electronic device (e.g., optical sensors having optical sensor components such as sensor light detectors and/or sensor light emitters), one or more of the optical components may be aligned with an image transport layer. In arrangements in which image transport layers overlap optical sensors and other components, light may be collimated and the angle of view associated with light-detecting components may be restricted, thereby enhancing optical component isolation. Image transport layers can also be configured to help accommodate optical sensors in the limited interior volume of an electronic device.

Figure 1:
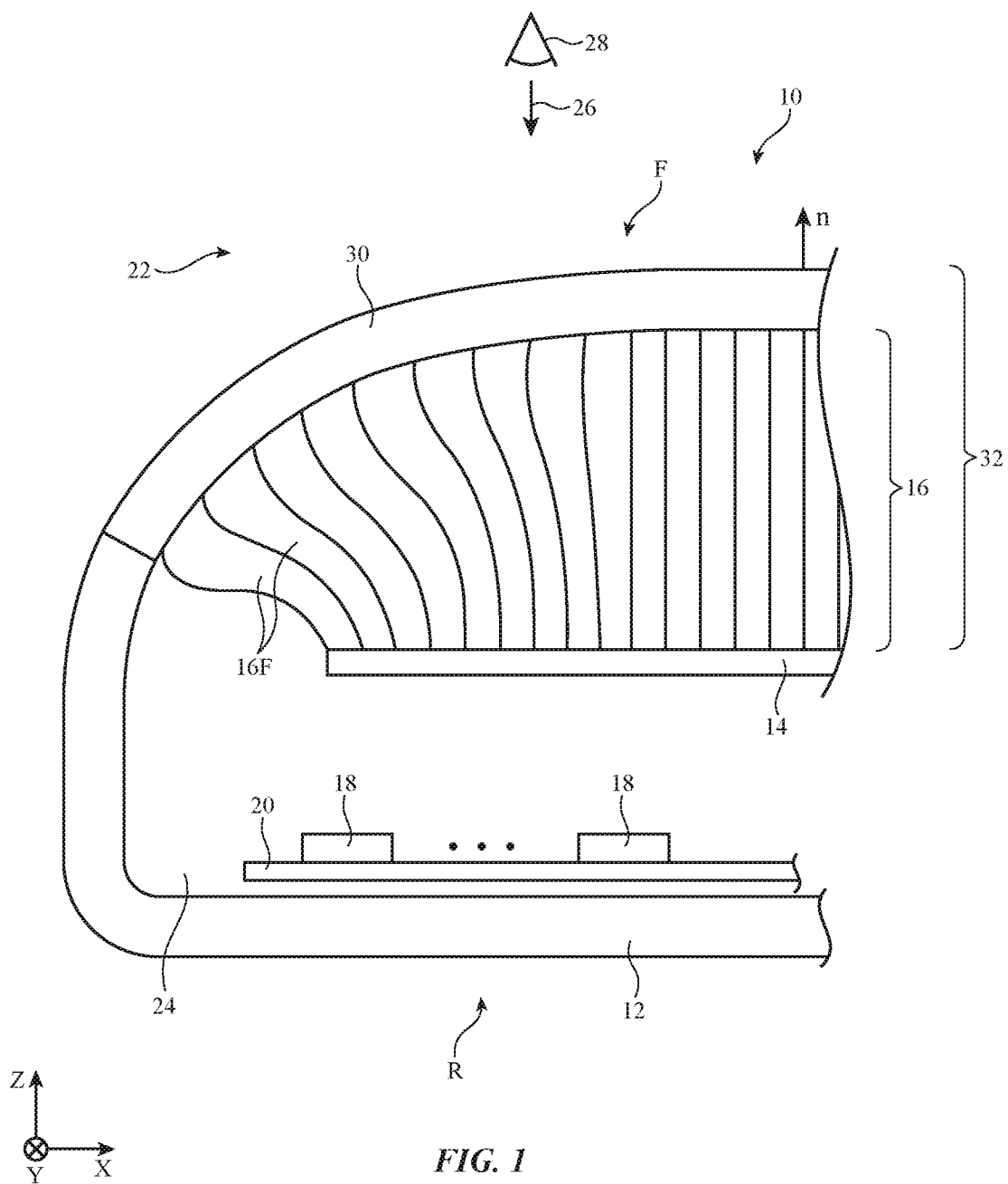
FIG. 1 is a side view of an illustrative electronic device with an image transport layer in accordance with an embodiment.

A cross-sectional side view of a portion of an illustrative electronic device with a display cover layer that includes an image transport layer is shown in FIG. 1. In the example of FIG. 1, device 10 is a portable device such as a cellular telephone, wristwatch, or tablet computer. In general, any type of electronic device may have an image transport layer such as a desktop computer, a voice-control speaker, a television or other non-portable display, a head-mounted device, an embedded system such as a system built into a vehicle or home, an electronic device accessory, and/or other electronic equipment.

Device 10 includes a housing such as housing 12. Housing 12 may be formed from polymer, metal, glass, crystalline material such as sapphire, ceramic, fabric, fibers, fiber composite material, natural materials such as wood and cotton, other materials, and/or combinations of such materials. Housing 12 may be configured to form housing walls. The housing walls may enclose one or more interior regions such as interior region 24 and may separate interior region 24 from exterior region 22. In some configurations, an opening may be formed in housing 12 for a data port, a power port, to accommodate audio components, or to accommodate other devices. Clear housing regions may be used to form optical component windows. Dielectric housing structures may be used to form radio-transparent areas for antennas and wireless power components.

Electrical components 18 may be mounted in interior region 24. Electrical components 18 may include integrated circuits, discrete components, light-emitting components, sensors, and/or other circuits and may, if desired, be interconnected using signal paths in one or more printed circuits such as printed circuit 20. If desired, one or more portions of the housing walls may be transparent (e.g., so that light associated with an image on a display or other light-emitting or light-detecting component can pass between interior region 24 and exterior region 22).

Electrical components 18 may include control circuitry. The control circuitry may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in the control circuitry may be used to control the operation of device 10. For example, the processing circuitry may use sensors and other input-output circuitry to gather input and to provide output and/or to transmit signals to external equipment. The processing circuitry may be based on one or more microprocessors, microcontrollers, digital signal processors, baseband processors, power management units, audio chips, application specific integrated circuits, etc. The control circuitry may include wired and/or wireless communications circuitry (e.g., antennas and associated radio-frequency transceiver circuitry such as cellular telephone communications circuitry, wireless local area network communications circuitry, etc.). The communications circuitry of the control circuitry may allow device 10 to communicate with other electronic devices. For example, the control circuitry (e.g., communications circuitry in the control circuitry) may be used to allow wired and/or wireless control commands and other communications to be conveyed between devices such as cellular telephones, tablet computers, laptop computers, desktop computers, head-mounted devices, handheld controllers, wristwatch devices, other wearable devices, keyboards, computer mice, remote controls, speakers, accessory displays, accessory cameras, and/or other electronic devices. Wireless communications circuitry may, for example, wirelessly transmit control signals and other information to external equipment in response to receiving user input or other input from sensors or other devices in components 18.

Input-output circuitry in components 18 of device 10 may be used to allow data to be supplied to device 10 and to allow data to be provided from device 10 to external devices. The input-output circuitry may include input devices that gather user input and other input and may include output devices that supply visual output, audible output, or other output.

Output may be provided using light-emitting diodes (e.g., crystalline semiconductor light-emitting diodes for status indicators and/or displays, organic light-emitting diodes in displays and other components), lasers, and other light-emitting devices, audio output devices (e.g., tone generators and/or speakers), haptic output devices (e.g., vibrators, electromagnetic actuators, piezoelectric actuators, and/or other equipment that supplies a user with haptic output), and other output devices.

The input-output circuitry of device 10 (e.g., the input-output circuitry of components 18) may include sensors. Sensors for device 10 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into a display, a two-dimensional capacitive touch sensor and/or a two-dimensional force sensor overlapping a display, and/or a touch sensor or force sensor that forms a button, trackpad, or other input device not associated with a display), and other sensors. Touch sensors for a display or for other touch components may be based on an array of capacitive touch sensor electrodes, acoustic touch sensor structures, resistive touch components, force-based touch sensor structures, a light-based touch sensor, or other suitable touch sensor arrangements. If desired, a display may have a force sensor for gathering force input (e.g., a two-dimensional force sensor may be used in gathering force input on a display).

If desired, the sensors may include optical sensors such as optical sensors that emit and detect light, optical touch sensors, optical proximity sensors, and/or other touch sensors and/or proximity sensors, monochromatic and color ambient light sensors, image sensors, fingerprint sensors, ultrasonic sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., time-of-flight image sensors, pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors.

In some configurations, components 18 may include mechanical devices for gathering input (e.g., buttons, joysticks, scrolling wheels, key pads with movable keys, keyboards with movable keys, and other devices for gathering user input). During operation, device 10 may use sensors and/or other input-output devices in components 18 to gather user input (e.g., buttons may be used to gather button press input, touch and/or force sensors overlapping displays can be used for gathering user touch screen input and/or force input, touch pads and/or force sensors may be used in gathering touch and/or force input, microphones may be used for gathering audio input, etc.). The control circuitry of device 10 can then take action based on this gathered information (e.g., by transmitting the information over a wired or wireless path to external equipment, by supplying a user with output using a haptic output device, visual output device, an audio component, or other input-output device in housing 12, etc.).

If desired, electronic device 10 may include a battery or other energy storage device, connector ports for supporting wired communications with ancillary equipment and for receiving wired power, and other circuitry. In some configurations, device 10 may serve as an accessory and/or may include a wired and/or wireless accessory (e.g., a keyboard, computer mouse, remote control, trackpad, etc.).

Device 10 may include one or more displays such as display 14. The displays may, for example, include an organic light-emitting diode display, a liquid crystal display, a display having an array of pixels formed from respective light-emitting diodes (e.g., a pixel array having pixels with crystalline light-emitting diodes formed from respective light-emitting diode dies such as micro-light-emitting diode dies), and/or other displays. The displays may include rigid display structures and/or may be flexible displays. For example, a light-emitting diode display may have a polymer substrate that is sufficiently flexible to be bent. Display 14 may have a rectangular pixel array or a pixel array of another shape for displaying images for a user and may therefore sometimes be referred to as a pixel array. Display 14 may also sometimes be referred to as a display panel, display layer, or pixel layer. Each pixel array in device 10 may be mounted under a transparent housing structure (sometimes referred to as a transparent display cover layer).

In the example of FIG. 1, display (pixel array) 14 is mounted under display cover layer 32. Display cover layer 32 (which may be considered to form a portion of the housing of device 10), covers front face F of device 10. Configurations in which opposing rear face R of device 10 and/or sidewall portions of device 10 have transparent structures covering displays and other optical components may also be used.

As shown in FIG. 1, display cover layer 32 may include image transport layer 16 and protective layer 30. Protective layer 30 may be formed from a layer of glass, clear polymer, crystalline material such as sapphire or other crystalline material, and/or other transparent material. The presence of layer 30 may help protect the outer surface of layer 16 from scratches. If desired, layer 30 may be omitted (e.g., in configurations in which a thin-film protective coating is present on the outer surface of layer 16, in configurations in which layer 16 is formed from hard material such as glass, and/or in other configurations in which layer 16 is resistant to scratching). A layer of adhesive and/or other structures may be formed between protective layer 30 and image transport layer 16 and/or may be included elsewhere in the stack of layers on display 14.

During operation, the pixels of display 14 produce image light that passes through image transport layer 16. In configurations in which image transport layer 16 is formed from a coherent fiber bundle, image transport layer 16 has optical fibers 16F. The fibers or other optical structures of image transport layer structures such as image transport layer 16 transport light (e.g., image light and/or other light) from one surface (e.g., an input surface of layer 16 that faces display 14) to another (e.g., an output surface of layer 16 that faces viewer 28, who is viewing device 10 in direction 26). As the image presented to the input surface of layer 16 is transported to the output surface of layer 16, the integrity of the image light is preserved. This allows an image produced by an array of pixels to be transferred from an input surface of a first shape at a first location to an output surface with a different shape (e.g., a shape with a footprint that differs from that of the input surface, a shape with a curved cross-sectional profile, a shape with a region of compound curvature, and/or a shape with other desired features).

Image transport layer 16 may therefore move the location of an image and may optionally change the shape of the surface on which the image is presented. In effect, viewer 28 will view the image from display 14 as if the image were generated on the output surface of image transport layer 16. In arrangements in which the image from display 14 is warped (geometrically distorted) by image transport layer 16, digital pre-distortion techniques or other compensation techniques may be used to ensure that the final image viewed on the output surface of image transport layer 16 has a desired appearance. For example, the image on display 14 may be prewarped so that this prewarped image is warped by an equal and opposite amount upon passing through layer 16. In this way, the prewarped image is effectively unwarped by passage through layer 16 will not appear distorted on the output surface.

In configurations of the type shown in FIG. 1, device 10 may have four peripheral edges and a rectangular footprint when viewed in direction 26 or may have other suitable shapes. To help minimize the size of inactive display borders as a user is viewing front face F of device 10 as shown in FIG. 1, the shapes of fibers 16F along the periphery of layer 16 may be deformed outwardly as shown in FIG. 1. These fibers 16F each have an outwardly bent segment that bends away from surface normal n of the center of layer 30 (e.g., away from an axis parallel to the Z axis of FIG. 1) and each have an inwardly bent segment that bends back towards surface normal n to help direct output light towards viewer 28.

The deformed shapes of fibers 16F (and/or the corresponding deformations made to optical filaments in Anderson localization material in layer 16) may help distribute image light laterally outwards in the X-Y plane so that the effective size of display 14 is enlarged and the image produced by display 14 covers some or all of the sidewalls of housing 12 or other peripheral portions of device 10 when the image on front face F is being viewed by viewer 28. For example, the bent shapes of fibers 16F of FIG. 1 may help shift portions of the displayed image laterally outward in the X-Y plane along the edges and corners of device 10 to block the edges of device 10 from view. In some arrangements, the portions of fibers 16F at the outermost surface of layer 16 are oriented parallel or nearly parallel with viewing direction 26 and the Z axis of FIG. 1, which helps ensure that some or all of the light that has passed through layer 16 will travel in the Z direction and be viewable by viewer 28.

Figure 2:
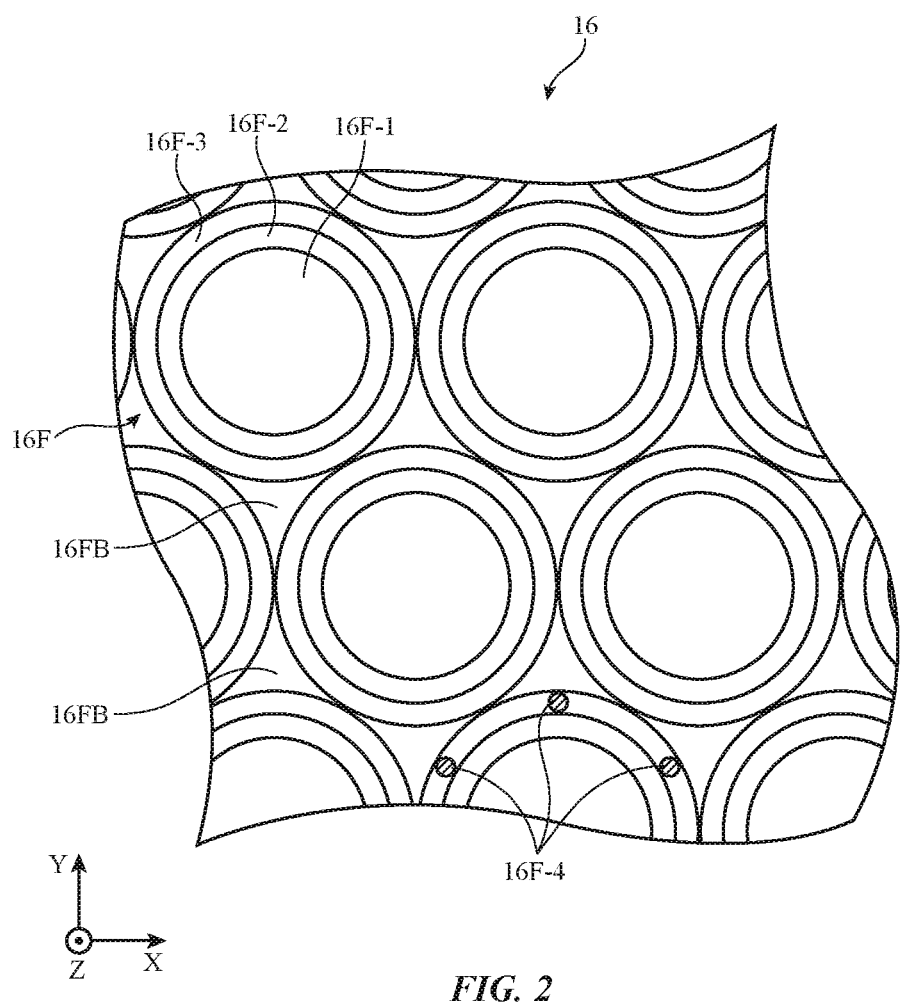
FIG. 2 is a cross-sectional view of a portion of an illustrative image transport layer formed using a coherent fiber bundle in accordance with an embodiment.

FIG. 2 is a cross-sectional view of a portion of image transport layer 16 in an illustrative configuration in which image transport layer 16 is formed from a coherent fiber bundle. Fibers 16F for layer 16 may have any suitable configuration. As shown in the example of FIG. 2, fibers 16F may each have a core such as core 16F-1. Cores 16F-1 and the other structures of image transport layer (e.g., cladding structures, binder, etc.) 16 may be formed from materials such as polymer, glass, crystalline material such as sapphire, and/or other materials. Some or all of these materials may be transparent. Arrangements in which some of the materials absorb light and/or have non-neutral colors or other light filtering properties may also be used.

Fiber cores 16F-1 may be formed from transparent material of a first refractive index and may be surrounded by cladding of a second, lower refractive index to promote light guiding in accordance with the principal of total internal reflection. In some arrangements, a single coating layer on cores 16F-1 may be used to form the cladding. In other arrangements, two or more coating layers on cores 16F-1 may be used to form the cladding. Clad fibers may be held together using binder 16FB, which serves to fill the interstitial spaces between the clad fibers and join fibers 16F together. In some configurations, stray light absorbing material may be incorporated into layer 16 (e.g., into some of the cores, cladding, and/or binder). The stray light absorbing material may be, for example, polymer, glass, or other material into which light-absorbing material such as dye and/or pigment has been incorporated.

In an illustrative configuration, layer 16 may have inner coating layers 16F-2 that are formed directly on the outer surfaces of cores 16F-1 and outer coating layers 16F-3 that are formed directly on the outer surfaces of layers 16F-2. Additional coating layers (e.g., three or more coating layers) or fewer coating layers (e.g., a single coating layer) may be formed on fiber cores 16F-1, if desired. Stray light-absorbing material may be used in layers 16F-2 and/or 16F-3 or other coating layer(s) on cores 16F-1. In an illustrative arrangement, layers 16F-2 and 16F-3, which may sometimes be referred to as forming first and second cladding portions (or first and second claddings) of the claddings for fiber cores 16F-1, may respectively be formed from transparent material and stray light-absorbing material. Other arrangements may be used, if desired (e.g., arrangements in which stray light absorbing material is incorporated into some or all of binder 16FB, arrangements in which cores 16F-1 are coated with inner and outer transparent claddings and an interposed intermediate stray-light-absorbing cladding, arrangements in which cores 16F-1 are covered with a single stray-light-absorbing cladding, arrangements in which some or all of fibers 16F are provided with longitudinally extending filaments 16F-4 of stray light absorbing material located, for example, on or in any of the cladding layers, etc.).

In configuration in which fibers 16F have claddings formed from two or more separate cladding layers, the cladding layers may have the same index of refraction or the outermost layers may have lower refractive index values (as examples). Binder 16FB may have a refractive index equal to the refractive index of the cladding material or lower than the refractive index of the cladding material to promote total internal reflection (as examples). For example, each fiber core 16F-1 may have a first index of refraction and the cladding material surrounding that core may have a second index of refraction that is lower than the first index of refraction by an index difference of at least 0.05, at least 0.1, at least 0.15, at least 10%, at least 20%, less than 50%, less than 30%, or other suitable amount. The binder refractive index may be the same as that of some or all of the cladding material or may be lower than the lowest refractive index of the cladding by an index difference of at least 0.05, at least 0.1, at least 0.15, at least 10%, at least 20%, less than 50%, less than 30%, or other suitable amount.

The diameters of cores 16F-1 may be, for example, at least 5 microns, at least 7 microns, at least 8 microns, at least 9 microns, less than 40 microns, less than 17 microns, less than 14 microns, less than 11 microns, or other suitable diameter. Fibers 16F (including cores and claddings) may have diameters of at least 6 microns, at least 7 microns, at least 8 microns, at least 9 microns, less than 50 microns, less than 17 microns, less than 14 microns, less than 11 microns, or other suitable diameter.

Fibers 16F may generally extend parallel to each other in image transport layer 16 (e.g., the fibers may run next to each other along the direction of light propagation through the fiber bundle). This allows image light or other light that is presented at the input surface to layer 16 to be conveyed to the output surface of layer 16.

If desired, image transport layer 16 may be formed from Anderson localization material in addition to or instead of fibers 16F. Anderson localization material is characterized by transversely random refractive index features (higher index regions and lower index regions) of about two wavelengths in lateral size that are configured to exhibit two-dimensional transverse Anderson localization of light (e.g., the light output from the display of device 10). These refractive index variations are longitudinally invariant (e.g., along the direction of light propagation, perpendicular to the surface normal of a layer of Anderson localization material).

Figure 3:
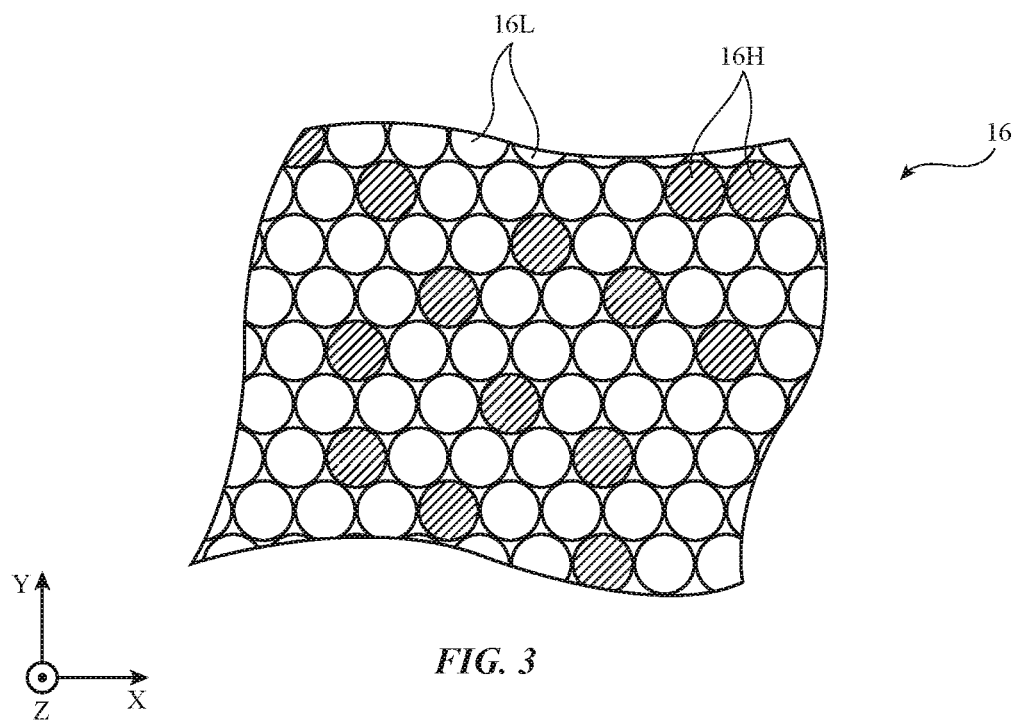
FIG. 3 is a cross-sectional view of a portion of an illustrative image transport layer formed using Anderson localization material in accordance with an embodiment.

FIG. 3 is a cross-sectional view of a portion of an image transport layer formed from Anderson localization material. In the example of FIG. 3, image transport layer 16 includes a random (pseudorandom) set of elongated optical structures of different refractive index values. These structures may, for example, be optical filaments that run into and out of the page of FIG. 3 and that have different refractive index values such as first filaments 16H with higher refractive index values and second filaments 16L with lower refractive index values. The refractive indices of filaments 16L and 16H may differ by any suitable amount (e.g., by at least 0.05, at least 0.1, at least 0.2, at least 0.3, by less than 0.8, etc.). The filaments may be distributed laterally (in dimensions X and Y) with a random pattern and may have any suitable cross-sectional shape (circular, rectangular, etc.). Anderson localization material preforms can be formed by drawing and assembling individual filaments of different refractive index values into bundles and/or can be formed by extruding lengths of material that include laterally interspersed areas of different respective refractive index values. Preforms can then be formed into layer 16 using one or more fusing and drawing operations. Other fabrication techniques may be used, if desired. To absorb stray light within an image transport layer formed from Anderson localization material, the Anderson localization material may include light absorbing material (e.g., light-absorbing filaments interspersed with transparent filaments or other light-absorbing structures).

Figure 4:
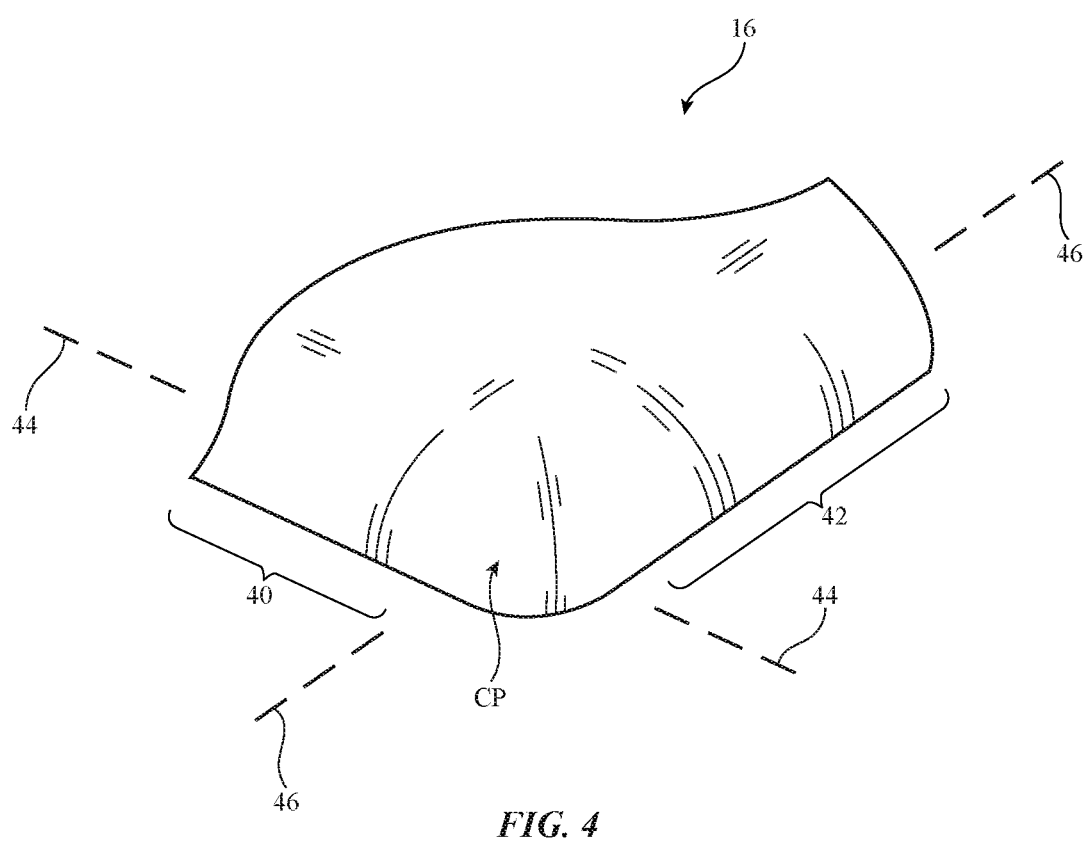
FIG. 4 is a perspective view of a portion of an image transport layer surface with compound curvature in accordance with an embodiment.

Image transport layers can be used to transport an image from a first surface (e.g., the surface of a pixel array) to a second surface (e.g., a surface in device 10 with compound curvature or other curved and/or planar surface shape) while preserving the integrity of the image. A perspective view of an illustrative corner portion of image transport layer 16 is shown in FIG. 4. In the example of FIG. 4, device 10 has edge portions 40 and 42 with surfaces that curve about axes 44 and 46, respectively. These portions of layer 16 may extend parallel to the straight sides of device 10 (as an example) and are characterized by curved surfaces that can be flattened into a plane without distortion (sometimes referred to as developable surfaces). At the corner of image transport layer 16 of FIG. 4, image transport layer 16 has curved surface portions CP with compound curvature (e.g., a surface that can only be flattened into a plane with distortion, sometimes referred to as a surface with Gaussian curvature). In a rectangular layout with curved corners, image transport layer 16 may have four corners with compound curvature. Image transport layers of other shapes (e.g., circular outlines, etc.) may also have surfaces with compound curvature (e.g., dome-shaped surfaces). When overlapped by protective layer 30, the overlapping portions of protective layer 30 may have corresponding surfaces with compound curvature. When selecting the size and shape of the output surface of layer 16 and therefore the size and shape of the image presented on the output surface, the use of an image transport layer material with compound curvature can provide design flexibility.

Figure 5:
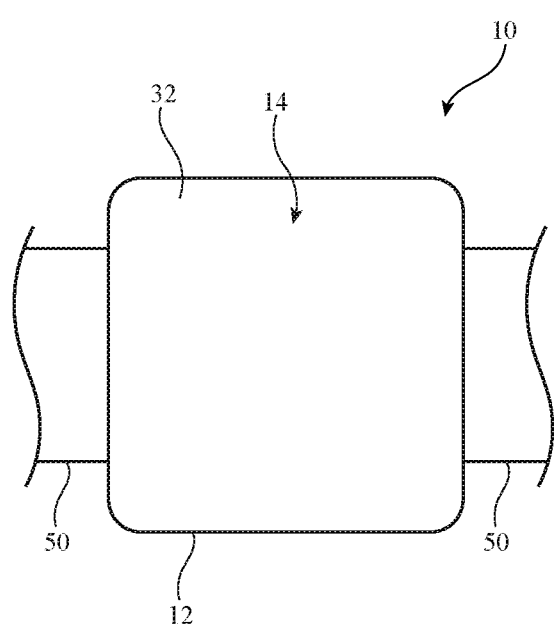
FIG. 5 is a top view of an illustrative electronic device in accordance with an embodiment.

In some arrangements, device 10 may include support structures such as wearable support structures. This allows device 10 to be worn on a body part of a user (e.g., the user's wrist, arm, head, leg, or other portion of the user's body). As an example, device 10 may include a wearable band, such as band 50 of FIG. 5. Band 50, which may sometimes be referred to as a wristband, wrist strap, or wristwatch band, may be formed from polymer, metal, fabric, leather or other natural materials, and/or other material, may have links, may stretch, may be attached to housing 12 in a fixed arrangement, may be detachably coupled to housing 12, may have a single segment or multiple segments joined by a clasp, and/or may have other features that facilitate the wearing of device 10 on a user's wrist.

To accommodate design goals such as increasing optical isolation between optical components while accommodating optical components and other devices within electronic device housings of limited size, electronic devices may be provided with image transport layers that overlap optical sensors and other optical devices.

Figure 6:
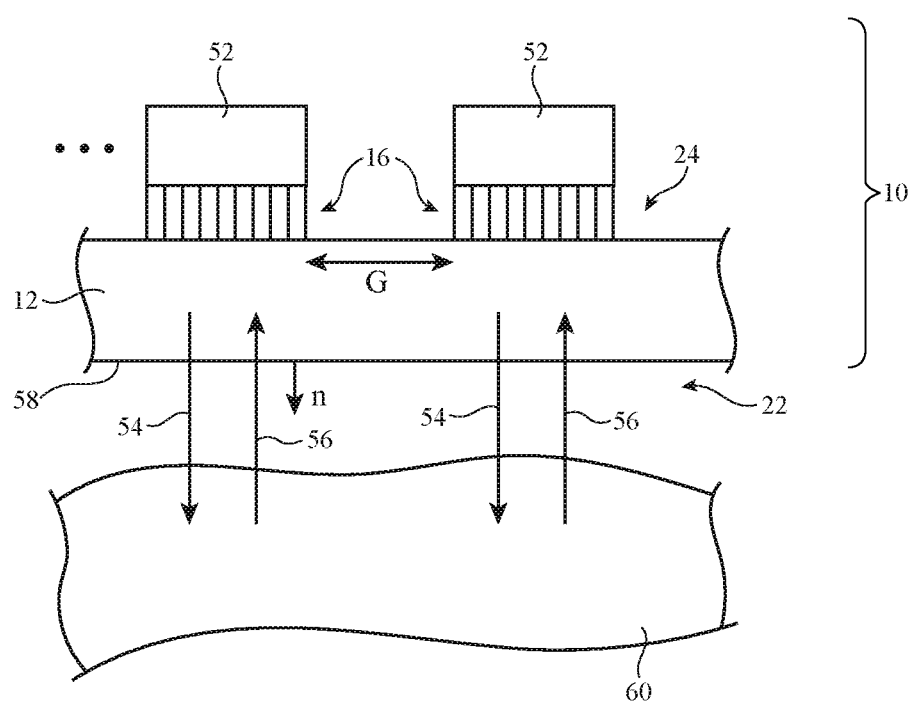
FIG. 6 is a cross-sectional side view of a portion of an illustrative electronic device with optical sensors in accordance with an embodiment.

Consider, as an example, illustrative electronic device 10 of FIG. 6. In the example of FIG. 6, device 10 has optical components 52. Optical components 52 may be optical sensors having optical sensor components that emit and/or detect light. Components 52 may, for example, include light-emitting devices such as light-emitting diodes and/or lasers and/or may include light-sensing components (e.g., photodetectors such as semiconductor photodiodes). Components 52 may emit light, may detect light, and/or may both emit and detect light. Examples of optical components 52 include camera flash devices, dot projectors for use with three-dimensional image sensors, status indicator lights, and/or other components that emit light and optical components that detect (and optionally emit) light such as optical touch sensors (e.g., touch sensors that emit light and detect reflected light from a user's finger or other external object), proximity sensors (e.g., sensors that emit light and measure reflected light to determine whether a user body part or other external object is within the vicinity of device 10), components that measure light intensity and/or color such as monochromatic and/or color ambient light sensors, biometric sensors such as sensors that measure blood oxygen levels, sensors that measure heart rates, sensors that detect whether skin is present or is not present (e.g., by analyzing reflected light spectra associated with light from a multi-wavelength light source that has reflected from a target), eye sensors such as gaze tracking sensors, lidar sensors, self-mixing sensors, and/or other optical sensors that can measure the distance to a target object and/or the position of the target object, optical thermal sensors (e.g., infrared sensors that measure temperature), single-element sensors (e.g., sensors that have a single photodetector and/or sensors that have a single light-emitting diode or laser), multi-element sensors (e.g., sensors that have multiple light-emitting devices and/or multiple light-sensing devices), devices with light sources and/or photodetectors in two-dimensional arrays (e.g., image sensors based on two-dimensional arrays of photodetectors, fingerprint sensors with arrays of photodetectors such as image sensor arrays and that optionally include one or more light sources such as an array of light-emitting devices, three-dimensional image sensors), spectrally sensitive sensors (e.g., sensors with photodetectors that are sensitive to different wavelengths of light such as a set of photodetectors each of which is configured to measure light in a different respective wavelength band), and/or other light-emitting and/or light-sensing circuitry. Optical components 52 may emit and/or detect light at any suitable wavelengths (e.g., one or more ultraviolet wavelengths, one or more visible light wavelengths, and/or one or more infrared light wavelengths).

As shown in FIG. 6, optical components 52 may operate through housing 12. The portion of housing 12 that overlaps components 52 may be formed from material that is transparent to the wavelength(s) of light being used by components 52. As an example, the portion of housing 12 that overlaps components 52 of FIG. 6 may be formed from polymer, glass, sapphire or other crystalline material, and/or other material that is transparent at visible light wavelengths used with components 52, that is transparent at infrared wavelengths used with components 52, and/or that is transparent at ultraviolet wavelengths used with components 52.

As shown in FIG. 6, components 52 may emit light 54 that passes through housing 12 from interior region 22 to exterior region 24 and/or may detect light 56 that is received from exterior 22 through housing 12. The portion of housing 12 through which this light passes may be part of a uniform housing wall, may be a window structure formed from a circular portion of housing 12 (e.g., a disk-shaped window member or other transparent window member that serves as a transparent housing wall structure inset within an opening in an opaque housing wall, etc.), may be part of display cover layer 32, and/or may form any other suitable portion of the housing and structural portions of device 10.

In the example of FIG. 6, optical components 52 are emitting light 54 that illuminates target object 60. Target object 60 may be a user's wrist, may be another user body part, or may be any other external object. Light that is illuminating object 60 such as light 56 is reflected (backscattered and/or specularly reflected) towards components 52. Photodetectors in components 52 can detect the magnitude of reflected light 56, the position of reflected light 56, and/or the amount of light 56 that is present at different wavelengths. The photodetector measurements may be used to provide device 10 with information about the reflection spectrum of object 60, the presence/absence of object 60 in the vicinity of device 10, and/or may serve as an indicator of touch input. As an example, when object 60 is touching exterior surface 58 of housing 12, light 56 may be detected and the presence of touch input may be confirmed, whereas when no touch input is being provided light 56 will be absent. An array of components 52 may be provided in device 10 and each of these components may be separated from adjacent components 52 by a gap G. The size of gap G may be, as an example, at least 0.5 mm, at least 1.5 mm, at least 3 mm, at least 6 mm, less than 5 cm, less than 2 cm, less than 1 mm, or other suitable distance. In the example of FIG. 6, housing 12 forms part of the rear surface of device 10 and components 52 are laterally spaced across the rear of device 10. Components 52 may be arranged in rows and columns, in a ring (e.g., a circular ring), along a single straight line or curved arc, in a radially symmetric pattern (e.g., a series of concentric rings), and/or in other suitable patterns.

Due to the placement of components 52, there is a risk of undesired crosstalk between adjacent components. For example, first and second adjacent components 52 may be emitting light 54. When the first component 52 measures reflected light 56, not all of that reflected light will be associated with light 54 from the first component. Some of the measured reflected light 56 at the first component will be associated with crosstalk light 54 from the second component. To reduce undesired crosstalk and thereby enhance the optical isolation between components 52, components 52 can be overlapped with image transport layer material such as coherent fiber bundle material and/or Anderson localization material. As shown in FIG. 6, for example, components 52 may be aligned with image transport layers 16. As light passes through layers 16, layers 16 narrow the angular distribution of light and thereby help reduce noise associated with adjacent components.

Consider, as an example, emitted light 54 of FIG. 6. As emitted light 54 travels outwardly through an image transport layer, the fibers or Anderson localization material of the image transport layer will tend to restrict the angular distribution of light emitted through housing 12. For example, light 54 that has passed through image transport layer 16 will be distributed in a cone about surface normal n of the output surface with a maximum angular extent (a maximum angle away from surface normal n), that is determined by the numerical aperture of the fibers in layer 16 or other optical characteristics of layer 16. The presence of image transport layer 16 therefore helps ensure that emitted light from component 52 is not distributed over too wide a range of angles, which could generate cross-talk for adjacent components 52.

The presence of image transport layer 16 may also restrict the angle of view of a photodetector in component 52 when component 52 is used to measure incoming light 56. In the absence of layer 16, for example, component 52 may measure incoming rays of light 56 that are oriented over a first (wide) range of angles relative to surface normal n. Layer 16 only accepts and guides light that is oriented at angles that are more closely aligned with surface normal n, so in the presence of layer 16 component 52 will measure incoming rays of light 56 that are oriented over a second (narrower) range of angles relative to surface normal n. By incorporating layer 16 between component 52 and object 60, device 10 can limit the ability of each component 52 to be affected by stray off-axis light (e.g., light emitted by an adjacent component), thereby reducing crosstalk.

As this example demonstrates, interposing coherent fiber bundles and/or other image transport layer material (e.g., Anderson localization material) between components 52 and exterior surface 58 of device 10 may help optically isolate components 52 from each other. Image transport layers 16 may be mounted between components 52 and transparent housing structures (e.g., a transparent wall in housing 12) and/or the outwardly facing surfaces of image transport layers 16 may form part of the exterior of device 10. Because image transport layers 16 may, in some configurations, be used bidirectionally, the inner surface of each layer 16 may potentially serve as an image transport layer input surface while the opposing outer surface of that layer serves as an image transport layer output surface and/or may potentially serve as an image transport layer output surface while the opposing outer surface of that layer serves as an image transport layer input surface.

Figure 7:
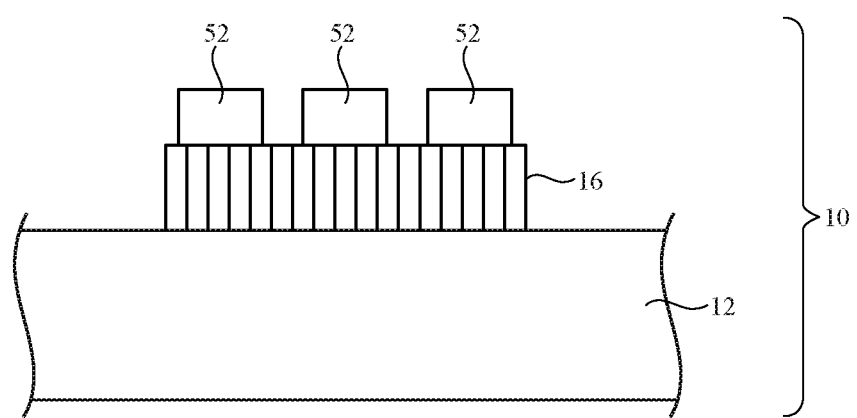
FIG. 7 is a cross-sectional side view of a portion of an illustrative electronic device with an image transport layer overlapped by multiple optical sensors in accordance with an embodiment.

If desired, multiple optical components 52 may overlap a common image transport layer 16, as shown in FIG. 7. This type of arrangement may help reduce the number of separate pieces of image transport layer material that are assembled into device 10.

Figure 8:
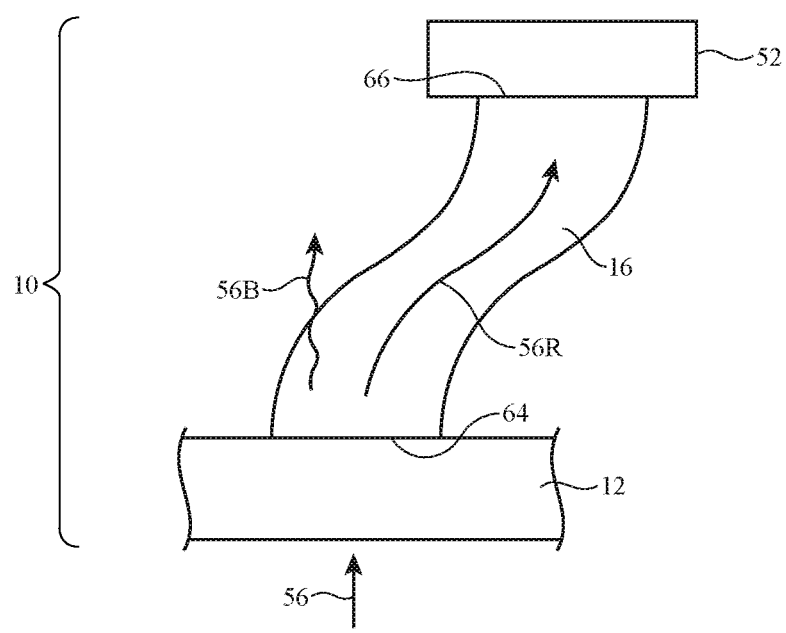
FIG. 8 is a cross-sectional side view of an illustrative image transport layer with a bend that creates a wavelength-dependent transmission characteristic for the image transport layer in accordance with an embodiment.

FIG. 8 shows how image transport layer 16 may have one or more bends. A bend in image transport layer 16 may cause image transport layer 16 to exhibit a wavelength-dependent transmission. In the example of FIG. 8, incoming light 56 is received at input surface 64 of image transport layer 16. A first portion of incoming light 56 such as portion 56R is conveyed through image transport layer 16 to output surface 66 of image transport layer 16 and is measured by a light sensor in optical component 52. A second portion of incoming light 56 such as light 56B is not well guided by the fibers or other structures in layer 16 and escapes image transport layer 16 (e.g., because total internal reflection is defeated by the bend in layer 16 for this light). The light that escapes layer 16 may have a different wavelength than the light that is guided through layer 16. For example, light 56B may have a shorter (or longer) wavelength of light than light 56R. In this way, a bent light guiding structure such as illustrative image transport layer 16 of FIG. 8 may serve both as a light guide and as a wavelength-dependent optical filter (e.g., to block undesired wavelengths of light from component 52, etc.).

Figure 9:
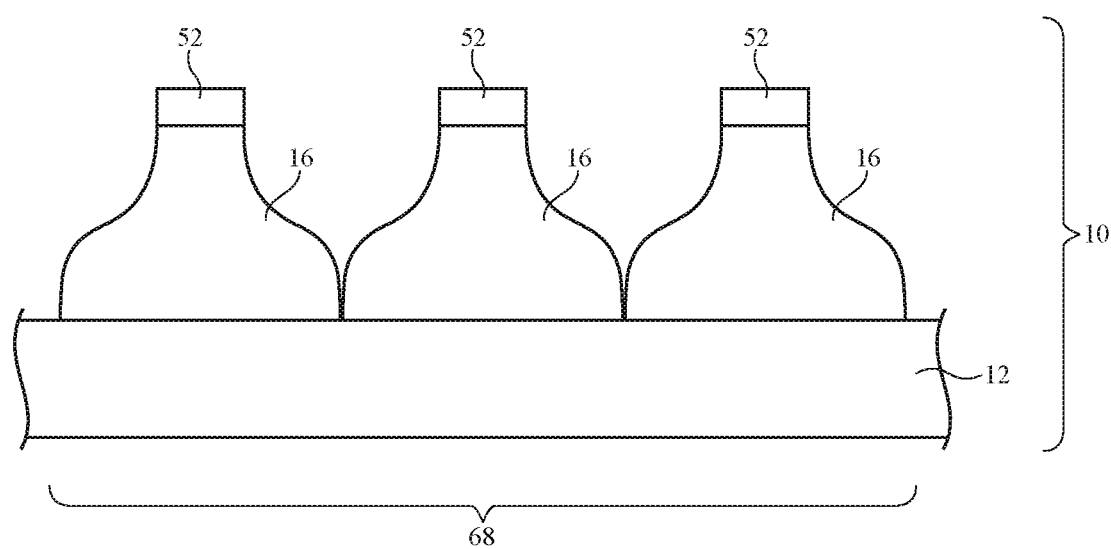
FIG. 9 is a cross-sectional side view of a portion of an illustrative electronic device with multiple optical sensors aligned with multiple tapered image transport layers in accordance with an embodiment.

In the example of FIG. 9, image transport layers 16 have tapered shapes. Image transport layers 16 of FIG. 9 are interposed between respective optical components 52 and a transparent portion of housing 12. In the FIG. 9 arrangement, image transport layers 16 flare outwardly (in one or two lateral dimensions) as a function of increasing distance from components 52 towards housing 12 and the exterior of device 10. This allows relatively small components 52 to cover a relatively larger area on the surface of device 10.

Figure 10:
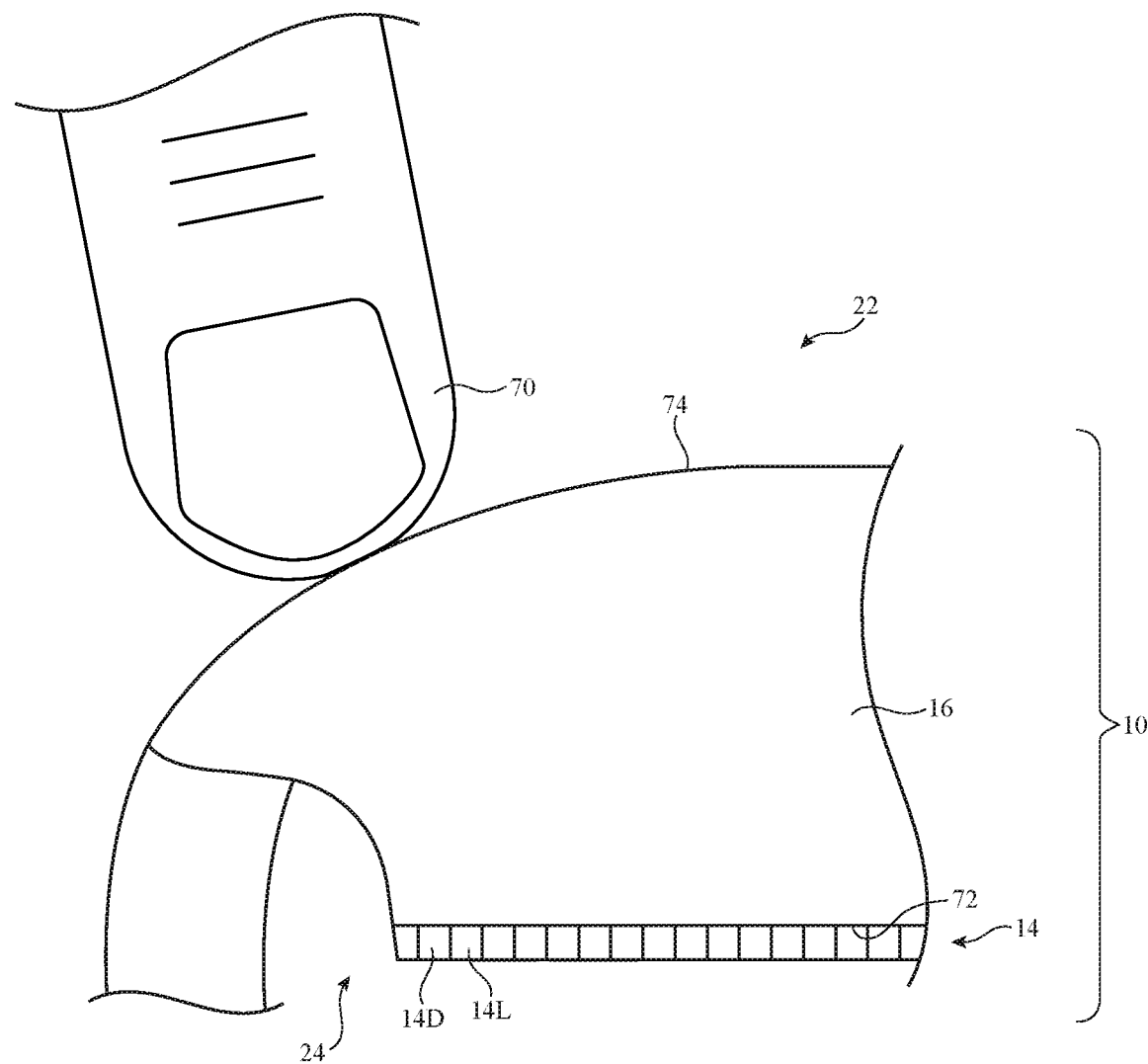
FIG. 10 is a cross-sectional side view of an illustrative electronic device with a display that includes an optical touch sensor that operates through an image transport layer in accordance with an embodiment.

As shown in the cross-sectional side view of FIG. 10, device 10 may, if desired, have an optical touch sensor that is overlapped by image transport layer 16. In the example of FIG. 10, housing 12 is coupled to image transport layer 16 (e.g., using adhesive, fasteners, and/or other coupling mechanisms). Electrical components are mounted in interior region 24 of device 10. Display 14 may contain an array of light-emitting pixels 14L. During operation of display 14, visible-light pixels among pixels 14L (sometimes referred to as display pixels or image-producing pixels) may display a visible-light image. The visible light image is received at input surface 72 of layer 16 and is conveyed to output surface 74 of layer 16.

Display 14 may also contain an array of photodetector pixels 14D. Pixels 14D may be thin-film photodetector pixels formed from photodiodes and/or other semiconductor photodetector circuitry and/or may be photodetectors formed from crystalline semiconductor dies. In some configurations, pixels 14D may be formed on a common substrate with some or all of pixels 14L (e.g., pixels 14L may include thin-film organic light-emitting diodes and pixels 14D may include thin-film photodetectors that are formed on a common flexible polymer layer or other substrate).

Configurations in which pixels 14D and/or pixels 14L are formed on two or more substrates may also be used. For example, display 14 may have a first layer that contains visible-light pixels configured to display an image and may contain a second layer with photodetectors. Optional infrared light-emitting pixels may be included in display 14 and may emit infrared light. These infrared light-emitting pixels (e.g., some of pixels 14L) may be formed on a common substrate with pixels 14D, may be formed on a common substrate with visible-light pixels 14L that are displaying an image, and/or may be formed on a separate substrate. If desired, pixels 14L may include visible light pixels that are used for producing illumination that reflects off of external objects for detection by pixels 14D (e.g., optical sensor illumination may be provided by visible light-emitting pixels in addition to or instead of infrared light-emitting pixels).

During operation, visible light and/or infrared light emitted by pixels 14L may be reflected from an external object that is present on output surface 74. In arrangements in which photodetector pixels 14D are sensitive to visible light, detectors 14D can monitor for reflections of visible light from external objects. In arrangements in which photodetector pixels 14D are sensitive to infrared light (e.g., when photodetector pixels 14D are infrared photodetectors), photodetector pixels 14D can monitor for reflections of infrared light from external objects (e.g., infrared light emitted by infrared light-emitting pixels 14L).

In the absence of external objects, emitted light from pixels 14L passes through exterior surface 74 to exterior region 22 and is not reflected back through layer 16 to photodetector pixels 14D. In the presence of an external object such as finger 70 that is touching surface 74, light that is illuminating finger 70 will reflect back through layer 16 to photodetector pixels 14D. By measuring the location and amount reflected light from finger 70 with an array of detectors such as photodetector pixels 14D associated with display 14, touch input can be gathered. The touch sensing circuitry of display 14 can therefore serve as a two-dimensional infrared touch sensor or two-dimensional visible-light touch sensor for gathering two-dimensional touch input (e.g., information on finger input from one or more fingers 70 on surface 74).

Touch sensor input (e.g., two-dimensional touch input) from an optical touch sensor associated with display 14 may be processed to gather touch gestures (e.g., single-finger gestures such as single taps, double taps, and swipes and multi-touch gestures such as pinch-to-zoom gestures). Pixels 14L and photodetector pixels 14D can be interspersed with each other in a rectangular array having rows and columns, and/or may have other patterns. In some configurations, there may be fewer photodetector pixels 14D than light-emitting pixels 14L.

If desired, optical components 52 of FIGS. 6, 7, 8, and 9 may be optical touch sensors. In general, any suitable image transport layer 16 (whether covered with protective layer 30 or other transparent housing structure or whether forming the outermost surface of device 10 in the absence of a transparent covering layer) may be provided with optical touch sensing or other optical sensing capabilities. The incorporation of a two-dimensional optical touch sensor into display 14 of FIG. 10 is illustrative.

Figure 11:
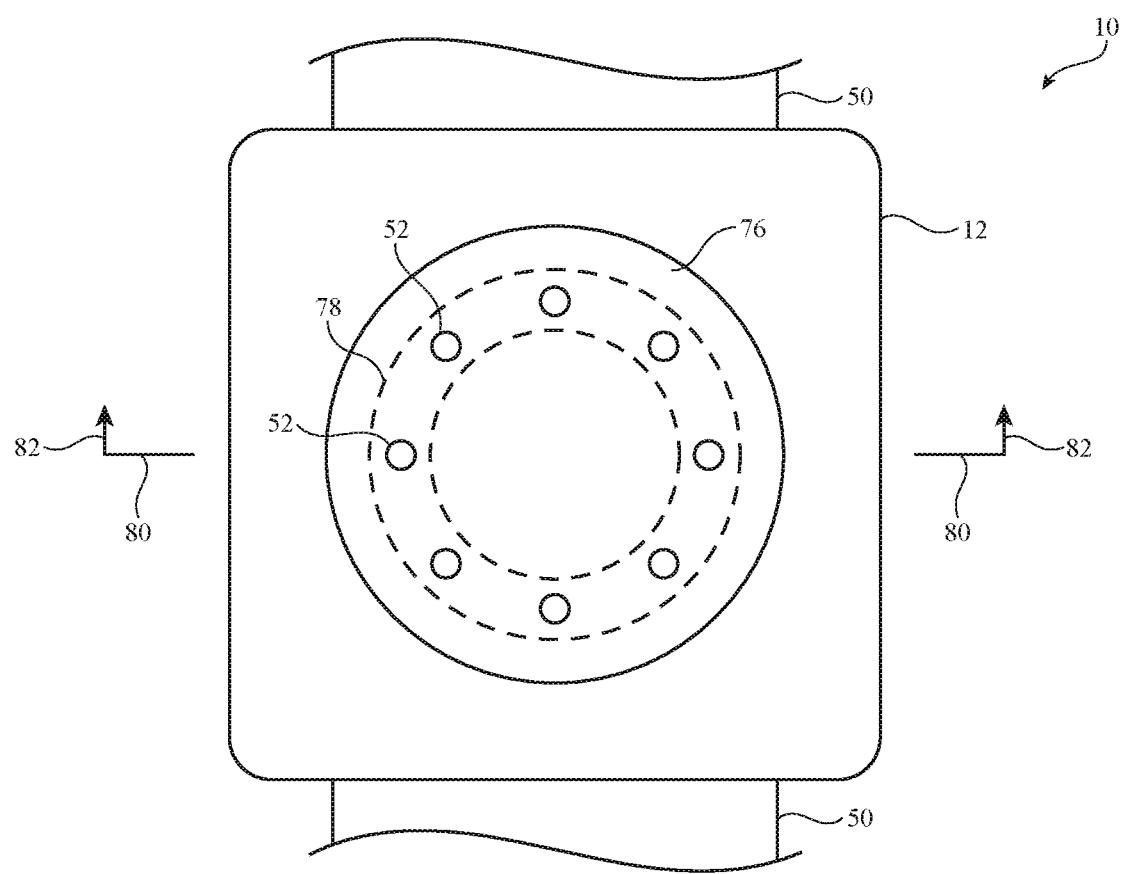
FIG. 11 is a rear view of an illustrative electronic device with optical sensors in accordance with an embodiment.

FIG. 11 is a rear view of an illustrative electronic device (e.g., a wristwatch with straps 50 coupled to housing 12 or other electronic device). Housing 12 of FIG. 11 has a transparent portion such as portion 76. Remaining portions of housing 12 on the rear of device 10 may be opaque (as an example). Portion 76 may be formed from transparent material such as glass, polymer, sapphire or other crystalline material, etc. If desired, some of the inner surface of portion 76 or other portions of housing 12 may be covered with opaque materials (e.g., a black ink coating or other coating). Other areas of portion 76 (or all of portion 76) may serve as windows for overlapped optical components 52. In the example of FIG. 11, optical components 52 are arranged in a ring-shaped array in ring-shaped region 78. There are eight components 52 in FIG. 11, but fewer components 52 or more components 52 may be used, if desired. As described in connection with FIG. 6, components 52 may be light-emitting devices and/or sensors and may be overlapped with image transport layer material.

Figure 12:
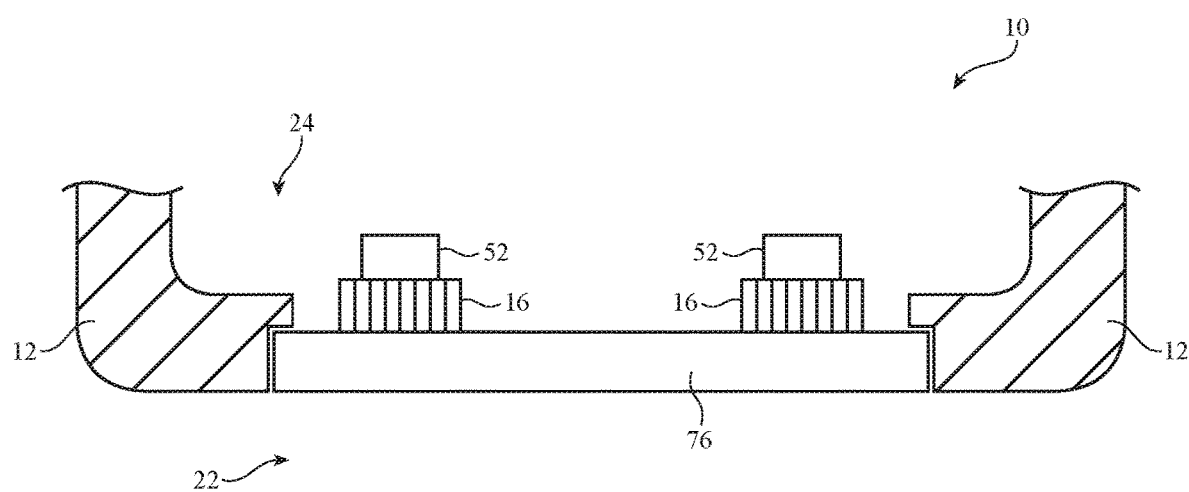
FIG. 12 is a cross-sectional side view of the illustrative electronic device of FIG. 11 in accordance with an embodiment.

FIG. 12 is a cross-sectional side view of device 10 of FIG. 11 taken along line 80 and viewed in direction 82 of FIG. 11. As shown in FIG. 12, portion 76 may be a disk-shaped transparent member that is received within a circular opening in remaining portions of housing 12 (e.g., opaque housing walls). Image transport layers 16 may be interposed between optical components 52 and portion 76 to help reduce optical crosstalk between components 52.

Figure 13:
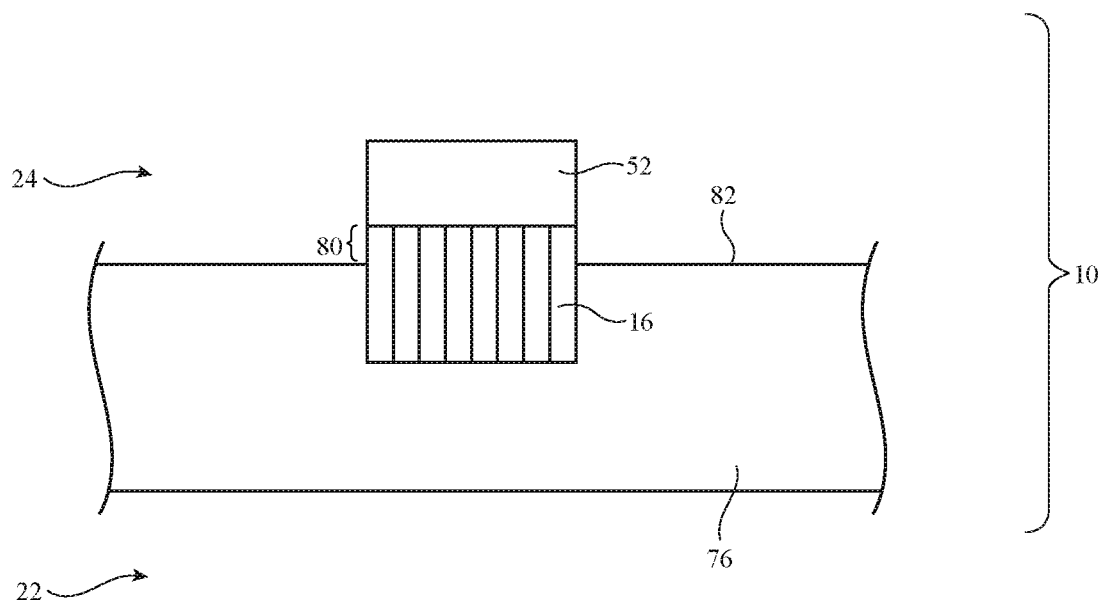
FIG. 13 is a cross-sectional side view of a portion of an illustrative electronic device with a transparent housing wall that has a recess to receive an image transport layer aligned with an optical sensor in accordance with an embodiment.

As shown in FIG. 13, portion 76 or other transparent housing structures (e.g., a transparent rear housing wall or other portions of housing 12 that are transparent such as protective layer 30 of FIG. 1), may be provided with recesses that receive image transport layer material. In particular, portion 76 has recess 80 and this recess is filled with image transport layer 16. Optical component 52 is aligned with image transport layer 16 and can transmit and/or receive light through layer 16. In the example of FIG. 13, part of image transport layer 16 protrudes inwardly into interior region 24 and is not received within recess 80. As a result, image transport layer 16 does not lie flush with inner surface 82. If desired, however, recesses 80 and image transport layers 16 may be configured so that image transport layers 16 are flush with interior surface 82.

Figure 14:
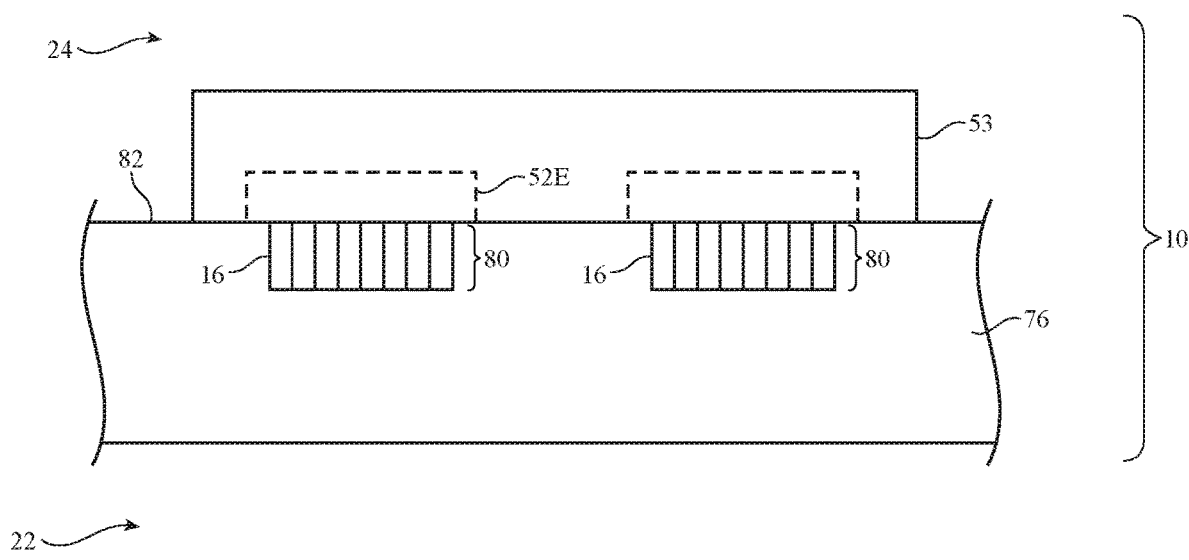
FIG. 14 is a cross-sectional side view of a portion of an illustrative electronic device that has optical sensor circuitry aligned with image transport layers in respective recesses within a transparent housing wall in accordance with an embodiment.

FIG. 14 shows an illustrative configuration in which image transport layers 16 are flush with interior surface 82 of portion 76. FIG. 14 also shows how component 52 (e.g., a single semiconductor die) may have multiple individual components 52E (e.g., multiple photodetectors and/or multiple light-emitting diodes or lasers). Each component 52E may overlap a respective image transport layer 16 or a common image transport layer 16 may overlap multiple components 52E as described in connection with image transport layer 16 and components 52 of FIG. 7.

Figure 15:
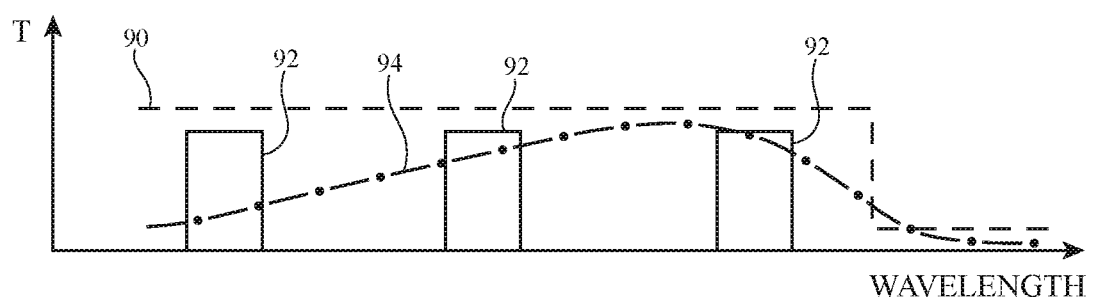
FIG. 15 is a graph showing illustrative transmission spectra for image transport layers in accordance with embodiments.

If desired, image transport layer 16 (e.g., binder, core material, cladding etc.) may have colorant (e.g., dye and/or pigment) that allows layer 16 to pass and/or block desired wavelengths of light. This allows an image transport layer to serve as a bandpass filter, a cut filter such as an infrared-light-blocking filter, a visible-light-blocking filter, or other optical filter. FIG. 15 is a graph in which light transmission T has been plotted as a function of wavelength for illustrative image transport layers. Each image transport layer 16 may be configured to pass shorter wavelength light (e.g., visible light) while blocking longer wavelength light (e.g., infrared light), as illustrated by transmission curve 90, may be configured to operate as a bandpass filter in one or more bands of wavelengths of interest, two or more bands, or three or more bands (see, e.g., illustrative bandpass filter pass bands 92 of FIG. 15), may be configured to exhibit other filtering characteristics (see, e.g., illustrative transmission characteristic 94 of FIG. 15), and/or may be configured to exhibit other light transmission characteristics and/or combinations of these characteristics.

Figure 16:
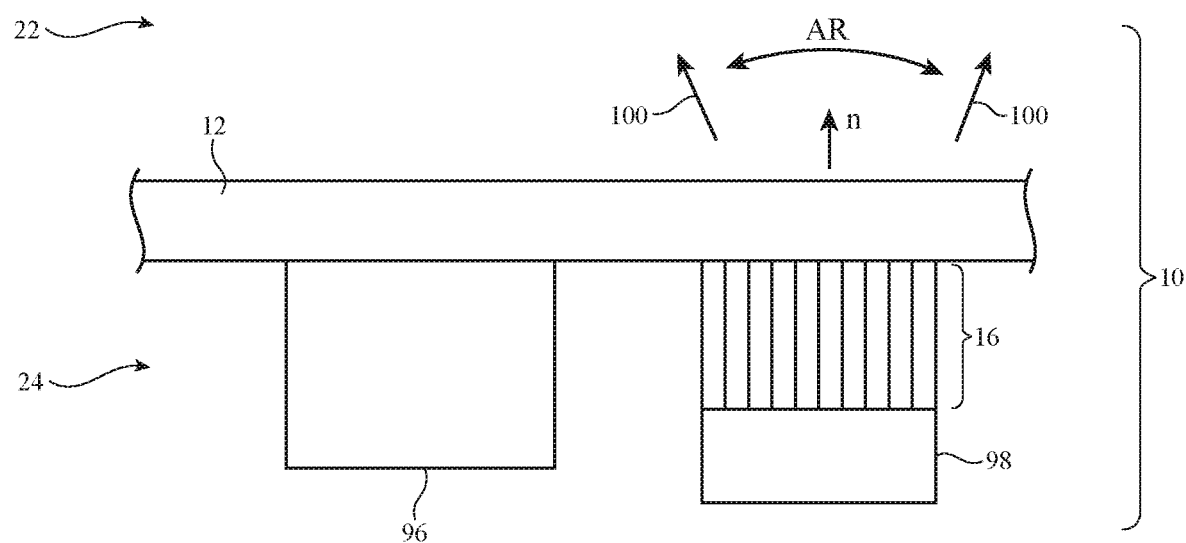
FIG. 16 is a cross-sectional side view of a portion of an illustrative electronic device that has a camera and that has a camera flash that is overlapped by an image transport layer in accordance with an embodiment.

The angular coverage of an optical component such as a camera flash can be narrowed using an image transport layer. Consider, as an example, the illustrative arrangement of FIG. 16. In the example of FIG. 16, device 10 has a first optical component such as camera 96 that is overlapped by a first portion of a transparent housing wall (housing 12) and a second optical component such as light source 98 that is overlapped by a second portion of the transparent housing wall. Camera 96 may include an image sensor (e.g., a two-dimensional image sensor or a three-dimensional image sensor) operating at visible light wavelengths or infrared wavelengths (e.g., camera 96 may be a visible camera or an infrared camera). Light source 98 may be a light-emitting diode that serves as a visible light camera flash or an infrared flood illuminator (e.g., an illuminator for a three-dimensional infrared image sensor).

During operation, light source 98 may emit light 100. Image transport layer 16 may be aligned with flash 98 to help collimate and restrict the angular spread of emitted light 100. As shown in the example of FIG. 16, emitted light 100 may be restricted to an angular range AR (where AR/2 is the angular spread of emitted light 100 relative to surface normal n of housing 12). In the absence of image transport layer 16 between the output of light source 98 and transparent housing 12, emitted light 100 may be emitted over an angular range BR that is greater than AR. When image transport layer 16 is present between housing 12 and light source 98 as shown in FIG. 16, however, the angular spread of emitted light may be controlled (e.g., to help direct emitted light 100 towards a desired target).

Figure 17:
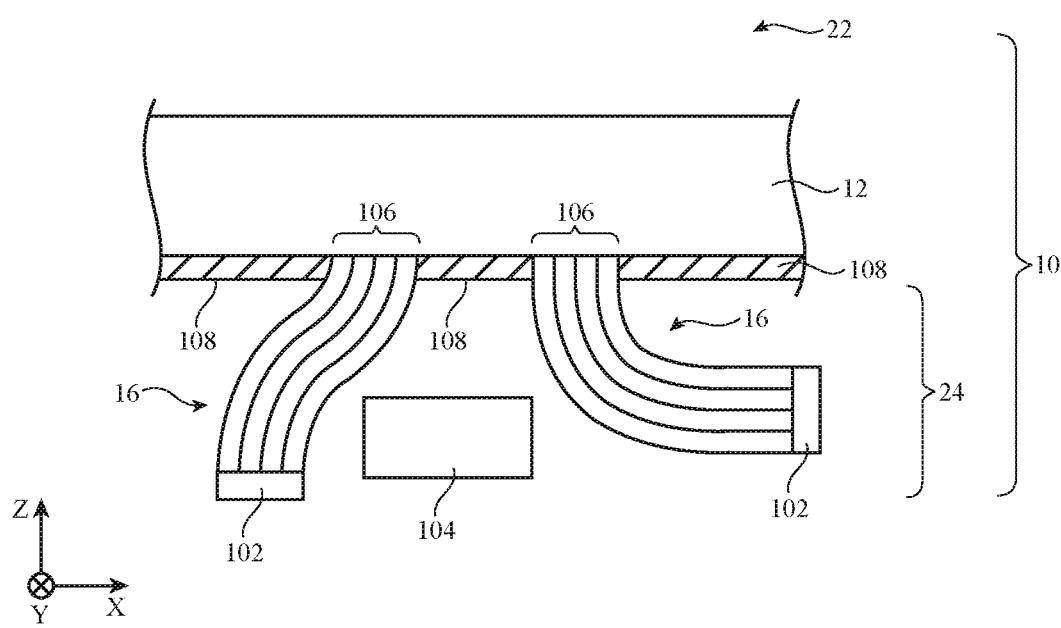
FIG. 17 is a cross-sectional side view of a portion of an illustrative electronic device with bent image transport layers and associated optical sensors in accordance with an embodiment.

FIG. 17 shows how image transport layers 16 may have one or more bends. This allows optical components 102 to be mounted in desired locations and with desired orientations (e.g., outwardly facing, sideways facing, etc.) in interior region 24 while accommodating other electrical components such as illustrative component 104 within interior region 24. Optical components 102 may be, for example, light-emitting diodes, other light-emitting components light-detecting components, infrared proximity sensors having infrared light-emitting devices and infrared photodetectors, ambient light sensors, other sensors, etc. Illustrative component 104 may be an antenna (e.g., a millimeter wave antenna or other antenna), a sensor, or other electrical component. It may be desirable, for example, for component 104 to be located in a position that allows component 104 to transmit and receive signals without being blocked by nearby structures. Component 104 may, if desired, be located away from nearby conductive structures (e.g., display components, metal housing structures, etc.) or other structures that might interfere with the operations of components 14.

In some configurations, optical components 102 may be located under windows 106 in an opaque layer such as opaque coating 108. Because image transport layers 16 may have a variety of different shapes (e.g., elongated shapes, shapes with bends, etc.), the use of image transport layers 16 to transport light from windows 106 to components 102 and/or from components 102 to windows 106) allows the placement of windows 106 to be selected based on considerations other than the locations of components 102 (e.g., other than the lateral position of components 102) in the X-Y plane. For example, rather than crowding windows 106 near each other or against a peripheral housing wall structure, windows 106 can be separated from each other and/or can be placed at evenly separated locations to enhance the appearance of windows 106 from exterior region 22. If, as an example, optical components 102 are mounted immediately adjacent to each other on a printed circuit, it is not necessary to form windows 106 immediately adjacent to each other in coating 108. Rather, image transport layers 16 can be used to route emitted and/or detected light to windows 106 that are located farther apart and/or that are evenly spaced (e.g., to enhance the appearance of device 10, to enhance optical isolation, etc.). Image transport layers 16 can therefor serve as light guides that provide flexibility in selection of mounting locations and/or orientations for components 102.

Figure 18:
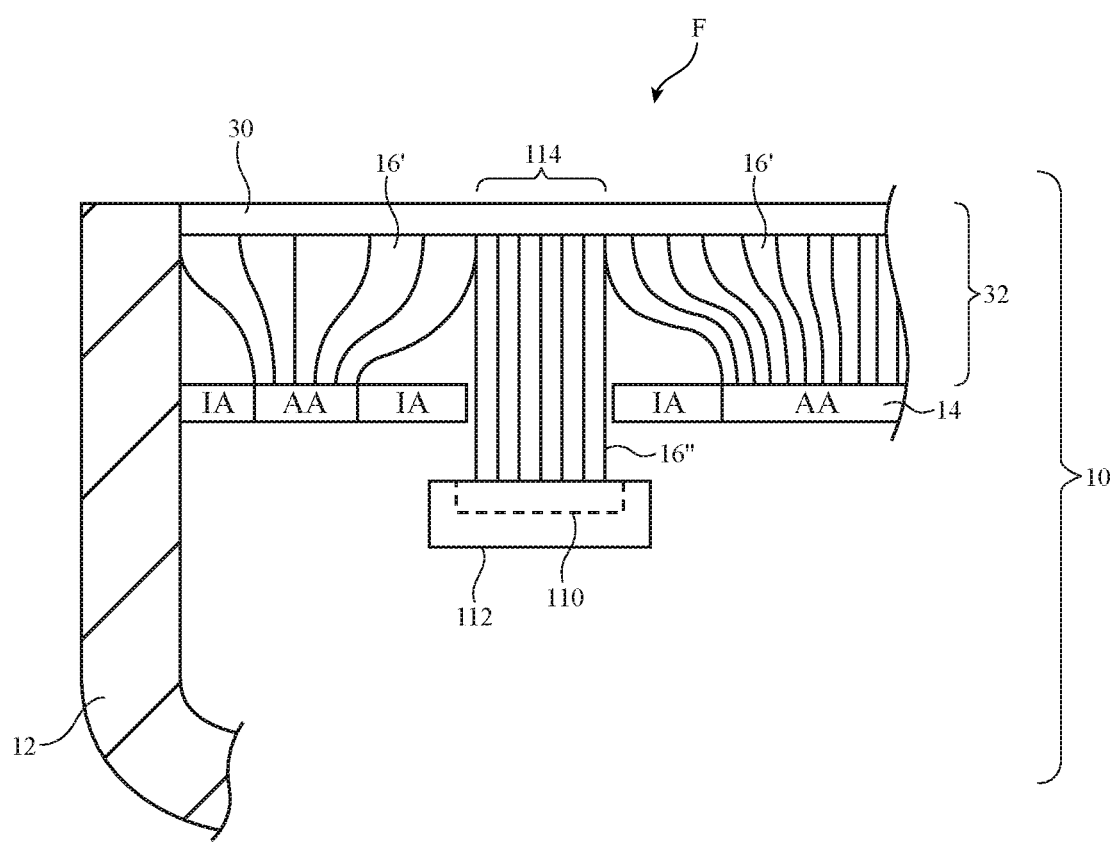
FIG. 18 is a cross-sectional side view of a portion of an illustrative electronic device with a display having an opening and having an overlapping image transport layer that accommodates an optical sensor in accordance with an embodiment.

FIG. 18 is a cross-sectional side view of a portion of an illustrative electronic device with a display having an opening to accommodate an optical component. As shown in FIG. 18, display 14 may have an active area AA that has pixels configured to display an image. Display 14 may also have display driver circuitry and other pixel-free structures that form an inactive area IA of display 14 that does not display images. Display 14 and display cover layer 32 may be mounted in housing 12. In the example of FIG. 18, an opening is formed in display 14 that is surrounded by a ring-shaped inactive area IA. Image transport layer 16" protrudes through this opening and is aligned with window region 114 of display cover layer 32. Protective layer 30 may help protect the outer surface of the image transport layer.

Optical component 112 (e.g., a sensor, a light-emitting device and/or light-sensing device, etc.) may have an active portion 110 for emitting and/or receiving light. Image transport layer 16" may be aligned with active portion 110 of component 112 and with window region 114. During operation, layer 16" may transport light (e.g., an image) from portion 110 to region 114 and/or may transport light from region 114 to portion 110. Image transport layer(s) 16' may have portions that are deformed laterally to overlap and thereby hide inactive area IA. Using this arrangement, the image output by display 14 can be displayed over all of the exterior surface of device 10 on front face F except in portion 114. The width of portion 114 can be tailored to match the size of portion 110 and need not be overly large.

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
a housing having a transparent wall;
a plurality of optical sensor components configured to operate through the transparent wall, wherein the optical sensor components comprise photodetectors; and
image transport layer material between the transparent wall and each of the optical sensor components, wherein the photodetectors detect light that passes through the image transport layer material and the transparent wall.

2. The electronic device defined in claim 1 wherein the image transport layer material is configured to form a plurality of separate image transport layers each interposed between a respective one of the optical sensor components and the transparent wall.

3. The electronic device defined in claim 2 further comprising a display on a first side the electronic device, wherein the transparent wall is on an opposing second side of the electronic device.

4. The electronic device defined in claim 3 wherein the transparent wall comprises crystalline transparent material.

5. The electronic device defined in claim 4 wherein the crystalline transparent material comprises sapphire.

6. The electronic device defined in claim 1 wherein the photodetectors comprise first and second photodetectors configured to detect light respectively in different first and second bands of wavelengths.

7. The electronic device defined in claim 1 wherein the transparent wall comprises a transparent rear housing wall comprising transparent material selected from the group consisting of: transparent polymer, transparent glass, and transparent crystalline material and wherein the transparent housing wall has a recess that receives the image transport layer material.

8. The electronic device defined in claim 1 wherein the image transport layer material is configured to form a single image transport layer that overlaps each of the optical sensor components.

9. The electronic device defined in claim 1 wherein the optical sensor components comprise a light-emitting diode.

10. The electronic device defined in claim 1 wherein the photodetectors are arranged in a ring and comprise first and second photodetectors that operate at different respective wavelength bands.

11. The electronic device defined in claim 1 wherein the image transport layer material comprises colorant and is configured to form an optical filter.

12. The electronic device defined in claim 1 wherein the image transport layer material is configured to form a member that is bent and exhibits wavelength-dependent light transmission.

13. The electronic device defined in claim 1 wherein the image transport layer material comprises a coherent fiber bundle.

14. A wristwatch, comprising:
a display;
a housing in which the display is mounted, wherein the housing has a transparent portion that does not overlap the display;
a band coupled to the housing;
photodetectors; and
coherent fiber bundle material between each of the photodetectors and the transparent portion, wherein the photodetectors detect light that passes through the coherent fiber bundle material and the transparent portion of the housing, wherein each of the photodetectors is configured to operate in a different respective visible-light wavelength band, and wherein the photodetectors are arranged in a ring.

15. The wristwatch defined in claim 14 wherein the transparent portion comprises a sapphire rear housing wall.

16. The wristwatch defined in claim 14 further comprising a light-emitting diode configured to emit light through a portion of the coherent fiber bundle material.

17. An electronic device, comprising:
a housing configured to separate an interior region from an exterior region;
an image transport layer that is coupled to the housing and that has opposing first and second surfaces; and
a two-dimensional infrared optical touch sensor having infrared photodetectors that detect infrared light passing through the image transport layer from the first surface to the second surface, wherein the two-dimensional infrared optical touch sensor is configured to receive touch input associated with an external object in the external region.

18. The electronic device defined in claim 17 further comprising:
a display in the housing that is configured to present an image to the second surface that is visible on the first surface.

19. The electronic device defined in claim 18 wherein the image transport layer comprises a coherent fiber bundle.

20. The electronic device defined in claim 19 further comprising a wrist strap coupled to the housing.

21. The electronic device defined in claim 20 wherein the two-dimensional infrared optical touch sensor comprises infrared light-emitting diodes configured to emit light that passes through the image transport layer from the second surface to the first surface.

22. The electronic device defined in claim 21 wherein the first surface is configured to be directly contacted by the external object.

23. The electronic device defined in claim 21 wherein the housing has a transparent protective layer that covers the first surface.

24. The electronic device defined in claim 21 wherein the display faces outwardly from the interior region in a first direction and wherein the housing has a transparent portion that faces outwardly from the interior region in an opposing second direction, the electronic device further comprising:
a plurality of optical components; and
fibers interposed between the plurality of optical components and the transparent portion, wherein light associated with the plurality of optical components passes through the fibers.

25. The electronic device defined in claim 17 further comprising:
a camera;
a bundle of fibers; and
a camera flash that emits illumination for the camera through the bundle of fibers.

* * * * *